United States Patent
Embon et al.

(10) Patent No.: US 9,922,144 B2
(45) Date of Patent: Mar. 20, 2018

(54) ENERGY AND CYCLE TIME EFFICIENCY BASED METHOD FOR ROBOT POSITIONING

(71) Applicant: Siemens Industry Software Ltd., Airport City (IL)

(72) Inventors: Lisandro Embon, Petah Tikva (IL); Moshe Hazan, Elad (IL); Rahav Madvil, Lezion (IL)

(73) Assignee: Siemens Industry Software Ltd., Airport City (IL)

( * ) Notice: Subject to any disclaimer, the term of this patent is extended or adjusted under 35 U.S.C. 154(b) by 896 days.

(21) Appl. No.: 14/340,365

(22) Filed: Jul. 24, 2014

(65) Prior Publication Data

US 2015/0278406 A1    Oct. 1, 2015

Related U.S. Application Data (63) Continuation-in-part of application No. 14/226,371, filed on Mar. 26, 2014, now abandoned.

(51) Int. Cl.
*G06F 17/50* (2006.01)
*G06F 17/30* (2006.01)
*B25J 9/16* (2006.01)

(52) U.S. Cl.
CPC ........ *G06F 17/5009* (2013.01); *B25J 9/1671* (2013.01); *G06F 17/3053* (2013.01);
(Continued)

(58) Field of Classification Search
CPC .............. G06F 17/5009; G06F 17/3053; B25J 9/1671; G05B 2219/49071;
(Continued)

(56) References Cited

U.S. PATENT DOCUMENTS

| 5,784,542 A | 7/1998 | Ohm et al. |
| 6,004,016 A | 12/1999 | Spector |

(Continued)

FOREIGN PATENT DOCUMENTS

| DE | 102008027475 A1 | 12/2009 |
| DE | 102010052253 A1 | 5/2012 |

(Continued)

OTHER PUBLICATIONS

Vergnano, Alberto et al. "Modeling and Optimization of Energy Consumption in Cooperative Multi-Robot Systems" IEEE Transactions on Automation Science and Engineering, vol. 9. No. 2, Apr. 2012, 6 pages.

(Continued)

*Primary Examiner* — Eunhee Kim (57) ABSTRACT

Methods for CAD, simulation, and corresponding systems and computer-readable mediums. A method includes receiving inputs including one or more of robot information, operation information, position information, and constraint information. The method includes generating a list of candidate positions of a robot. The method includes, for each candidate position, determining a time value of the candidate position and when the time value of the candidate position does not meet a threshold cycle time value, removing the candidate position. The method includes, for each candidate position, determining an energy consumption value of the candidate position. The method includes, for each candidate position, determining one or more of a rating and a ranking for the candidate position based on the time value and the energy consumption value. The method includes determining the optimal position of the robot based on the ranking of each candidate position.

20 Claims, 5 Drawing Sheets

(52) U.S. Cl.
CPC ............. *G05B 2219/39361* (2013.01); *G05B 2219/39407* (2013.01); *G05B 2219/42217* (2013.01); *G05B 2219/49071* (2013.01)

(58) Field of Classification Search
CPC ........... G05B 2219/42217; G05B 2219/39407; G05B 2219/39361
USPC ............................. 703/13; 700/245; 707/748
See application file for complete search history.

(56) References Cited

U.S. PATENT DOCUMENTS

| | | | |
|---|---|---|---|
| 6,216,058 B1 | 4/2001 | Hosek et al. | |
| 6,493,607 B1 | 12/2002 | Bourne et al. | |
| 6,728,599 B2 | 4/2004 | Wang et al. | |
| 7,298,385 B2 | 11/2007 | Kazi et al. | |
| 7,386,365 B2 | 6/2008 | Nixon | |
| 8,401,698 B2* | 3/2013 | Kamrani | B25J 9/1661 700/173 |
| 8,447,455 B2 | 5/2013 | Matsunaga | |
| 8,620,473 B2 | 12/2013 | Diolaiti et al. | |
| 9,057,621 B2 | 6/2015 | Tate et al. | |
| 9,298,863 B2 | 3/2016 | Hazan | |
| 9,469,029 B2 | 10/2016 | Hazan | |
| 9,725,013 B2* | 8/2017 | Romanov | B60L 15/2036 |
| 2004/0111183 A1 | 6/2004 | Sutherland et al. | |
| 2005/0004709 A1* | 1/2005 | Watanabe | B25J 9/1664 700/245 |
| 2005/0055132 A1 | 3/2005 | Matsumoto et al. | |
| 2005/0137648 A1 | 6/2005 | Cosendai et al. | |
| 2005/0197680 A1 | 9/2005 | DelMain et al. | |
| 2006/0025890 A1 | 2/2006 | Nagatsuka et al. | |
| 2006/0145647 A1 | 7/2006 | Kitatsuji et al. | |
| 2006/0217841 A1 | 9/2006 | Matsumoto et al. | |
| 2006/0287769 A1 | 12/2006 | Yanagita et al. | |
| 2008/0009971 A1 | 1/2008 | Kim et al. | |
| 2008/0306628 A1 | 12/2008 | Ng-Thow-Hing et al. | |
| 2009/0105880 A1 | 4/2009 | Okazaki | |
| 2010/0224022 A1 | 9/2010 | Choi et al. | |
| 2010/0305751 A1 | 12/2010 | Nagatsuka | |
| 2011/0153080 A1 | 6/2011 | Shapiro et al. | |
| 2012/0158174 A1 | 6/2012 | Moon et al. | |
| 2012/0165982 A1 | 6/2012 | Kim et al. | |
| 2012/0290131 A1 | 11/2012 | Khoukhi | |
| 2013/0030569 A1 | 1/2013 | Fudaba et al. | |
| 2013/0116822 A1 | 5/2013 | Atohira | |
| 2014/0005804 A1 | 1/2014 | Brand | |
| 2014/0156068 A1 | 6/2014 | Graca et al. | |
| 2014/0163736 A1 | 6/2014 | Azizian et al. | |
| 2014/0207837 A1 | 7/2014 | Taniguchi et al. | |
| 2014/0257558 A1 | 9/2014 | Frische et al. | |
| 2015/0148952 A1 | 5/2015 | Shiratsuchi | |
| 2015/0177194 A1 | 6/2015 | Xu et al. | |
| 2015/0278404 A1 | 10/2015 | Embon et al. | |
| 2015/0278406 A1 | 10/2015 | Embon et al. | |

FOREIGN PATENT DOCUMENTS

| | | | |
|---|---|---|---|
| DE | 102012101497 A1 | 8/2013 | |
| EP | 1090723 A2 | 4/2001 | |
| EP | 2157490 A1 | 2/2010 | |
| EP | 2485875 B1 | 4/2013 | |
| JP | 2004243461 A | 9/2004 | |
| JP | 2006192554 A | 7/2006 | |
| WO | 2005049284 A1 | 6/2005 | |
| WO | 2005124486 A2 | 12/2005 | |
| WO | 2011042293 A1 | 4/2011 | |
| WO | 2014052286 A1 | 4/2014 | |

OTHER PUBLICATIONS

Diaz, Nancy et al. "Cost and Energy Consumption Optimization of Product Manufacture in a Flexible Manufacturing System" Laboratory for Manufacturing and Sustainability, University of California at Berkeley, USA, 8 pages.

Bernhardt, R., et al., "Development of Virtual Robot Controllers and Future Trends," 6th IFAC Symposium on Cost Oriented Automation, Berlin, Germany, Oct. 8-9, 2001, 7 pages.

Bernhardt, R., "Von Realistischer Roboter Simulation Zu Virtuellen Steuerungen," ZWF, Zeitschrift fur Wirtschaftlichen Fabrikbetrieb, 2000, Munich, 5 pages. ( No translation).

Bernhart, R., et al., "Realistic Robot Simulation in Concurrent Engineering of Manufacturing Lines in Automative Industries," Eight ISPE International Conference on Concurrent Engineering : Research and Applications, Jul. 29-Aug. 1, 2002, 5 pages.

Bernhardt, R., et al., "The Virtual Robot Controller (VRC) Interface," ISATA 2000, Automation and Transportation Technology Simulation and Virtual Reality, Dublin, Ireland, Sep. 25-27, 2000, 6 pages.

Bernhardt, R., et al., "Virtual Robot Controller (VRC) Interface," Robotik, 2000, 7 pages. ( No Translation).

Bernhart, R., et al., "Virtual Robot Controller as Simulation Agents," 2nd Workshop on Agent Based Simulation, ISBN 1-56555-215-6, Passau, Germany, Apr. 2-4, 2001, 6 pages.

Chen, P., et al. "SANDROS: A Motion Planner with Performance Proportional to Task Difficulty," Proceedings of the 1992 IEEE International Conference on Robotics and Automation, Nice, France, May 1992, 8 Pages.

Faverjon, B., et al., "The mixed Approach for Motion Planning: Learning Global Strategies from a Local Planner," Proceedings of the International Joint Conference on Artifical Intelligence, Jan. 1, 1987, 7 pages.

Gueta, L., et al., "Compact Design of Work Cell with Robot Arm and Positioning Table Under a Task Completion Time Constraint," 2009 IEEE/RSJ International Conference on Intelligent Robots and Systems, St. Louis, MS, USA, Oct. 11-15, 2009, 7 pages.

Gueta, L., et al., "Practical Point-to-Point Multiple-Goal Task Realization in a Robot Arm with a Rotating Table," Advanced Robotics, vol. 25, No. 6-7, 2011, pp. 717-738.

Hirakawa, A., "Trajectory Generation for Redundant Manipulators Under Optimization of Consumed Electrical Energy," Conference Record of the 1996 IEEE Industry Applications Conference—31st IAS Annual Meeting, IEEE Service Center, US, vol. 6, Oct. 6, 1996, XP010201236.

Hwang, Y,. Et al., "Optimizing Robot Placement for Visit-Point Tasks" Proceedings of the AI and Manufacturing Research Planning Workshop, Albuquerque, NM, USA, Jun. 1996, 7 pages.

"Realistic Robot Simulation (RRS)," www.realistic-robot-simulation.org, Fraunhofer IPK, 2009, Retrieved Jul. 26, 2014, 4 pages.

Willnow, C., et al., "Virtual Time Management of Virtual Robot Controllers," Modeling and Simulation 2001, 15th European Simulation Multiconference 2001, ESM' 2001, Jun. 6-9, 2001, Prague, Czech Republic, 8 pages.

Foreign Communication from a Related Counterpart Application, PCT Application No. PCT/US2013/061340, International Search Report dated Jan. 31, 2014, 6 pages.

Foreign Communication from a Related Counterpart Application, PCT Application No. PCT/US2014/021801, International Search Report dated Sep. 3, 2014, 5 pages.

U.S. Appl. No. 14/448,416, Non-Final Office Action dated Aug. 25, 2015, 9 pages.

U.S. Appl. No. 14/197,620, Final Office Action dated Jul. 31, 2015, 16 pages.

Cao, Bailin et al. "Practical Implementation of Time-efficient Trajectory Planning for Two Cooperative Industrial Robot Arms", Proceedings of the 1996 IEEE/RSJ International Conference on Robots and Systems (IROS). Robotic Intelligence Interacting with Synamic Worlds, Osaka, Nov. 4-8, 1996, XP000771580, ISBN: 978-0-7803-3214-0, 8 pages.

Wang, Fei-Yue et al. "Planning Time-Optimal Trajectory for Coordinated Robot Arms", Proceedings of the International Conference on Robotics and Automation Atlanta, May 2-6, 1993, Los Alamitos, IEEE Comp. Soc. Press, US, vol. Conf. 10, May 2, 1993, XP010095120, ISBN; 978-0-8186-3450-5, 6 pages.

(56) References Cited

OTHER PUBLICATIONS

Baba N. et al: "Collision avoidance planning of a robot manipulator by using genetic algorithm—A consideration for the problem in which moving obstacles and/or several robots are included in the workspace"; Evolutionary Computation, 1994; IEEE World Congress on Computational Intelligence; First IEEE Conference Orlando, Fl. USA Jun. 27-29, 1994; XP010122796; ISBN: 978-0-7803-1899-1, 6 pages.

Sanchez, G. et al., "Locally-Optimal Path Planning by Using Probabilistic RoadMaps and Simulated Annealing". IASTED Int'l Conf. on Robotics and Applications, Oct. 1999, 6 pages.

Ahuactzin, J.M. et al., "Using genetic algorithms for robot motion planning," in Proc. of 10th European Conference on Artificial Intelligence, 5 pages (1992).

Bohlin & Kavraki, "Path Planning Using Lazy PRM", Proceeding of the 2000 EEE International Conf. on Robotics & Automation, pp. 521-528, Apr. 2000 (8 pages).

Tian, L. et al., "An effective robot trajectory planning method using a genetic algorithm", Mechatronics, 14, pp. 455-470. (2004) (16 pages).

Yue, S.G. et al., "Point-to-point trajectory planning of flexible redundant robot manipulators using genetic algorithms", to appear in Robotica. (2001) pp. 1-24 (24 pages).

Skiena, Steven S., The Algorithm Design Manual, 2nd ed., Chapter 6, "Weighted Graph Algorithms," Springer, London, Aug. 2008 (39 pages).

Hein et al., "Automated generated collision-free time optimized robot movements . . . based on rounding", Int'l Symp. on Assembly & Task Planning, pp. 110-115, May 2001 (6 pgs).

Gasparetto et al. "Trajectory Planning in Robotics," Mathematics in Computer Science, vol. 6, No. 3, Aug. 30, 2012, pp. 269-279, XP035125437, 11 pages.

EP Search Report dated Jul. 22, 2015, for EP application 15160330. 5-1958, 8 pages.

EP Office Action dated Oct. 16, 2017, for EP Application No. 15160330.5, 7 pages.

* cited by examiner

ENERGY AND CYCLE TIME EFFICIENCY BASED METHOD FOR ROBOT POSITIONING

CROSS-REFERENCE TO OTHER APPLICATION

This application is a continuation-in-part to U.S. patent application Ser. No. 14/226,371, filed Mar. 26, 2014, entitled "Energy and Cycle Time Efficiency Based Method for Robot Positioning." The content of the above-identified patent document is hereby incorporated by reference.

TECHNICAL FIELD

The present disclosure is directed, in general, to computer-aided design, visualization, and manufacturing systems, product lifecycle management ("PLM") systems, product data management (PDM) systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include CAD and simulation methods and corresponding systems and computer-readable mediums. A method includes receiving inputs including one or more of robot information, operation information, position information, and constraint information. The method includes generating a list of candidate positions of a robot. The method includes, for each candidate position, determining a time value of the candidate position and when the time value of the candidate position does not meet a threshold cycle time value, removing the candidate position. The method includes, for each candidate position, determining an energy consumption value of the candidate position. The method includes, for each candidate position, determining a rating and a ranking for the candidate position based on the time value and the energy consumption value. The method includes transmitting the optimal position of the robot based on the ranking of each candidate position.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Seeking a suitable position for a robot requires consideration of numerous constraints that make finding the optimal position a complex task. Constraints can include whether the robot can reach all locations from a given robot position and whether any collisions occur with the robot and any objects within its environment. A limited cycle time for completing tasks is another constraint that relates to production costs.

Robots can be heavy power consumers. Robots work repeatedly on one or more tasks for long hours and have complex powertrains that can include engines, transmissions, and so on. In a typical production line, there can be many robots, which further amplifies these issues.

Embodiments according to the disclosure find the most efficient or optimal robot position based on given constraints and in terms of power consumption and cycle time. The energy to time correlation can include ratings and rankings of the results of simulations that generate power or energy consumption values and cycle time values.

Applying this approach on every robot in a production line reduces the energy consumption and task cycle time resulting in reduced production costs. The reduced production costs come from finding optimal position(s) for each robot in the production line to reduce overall energy consumption and cycle time.

Figure 1:
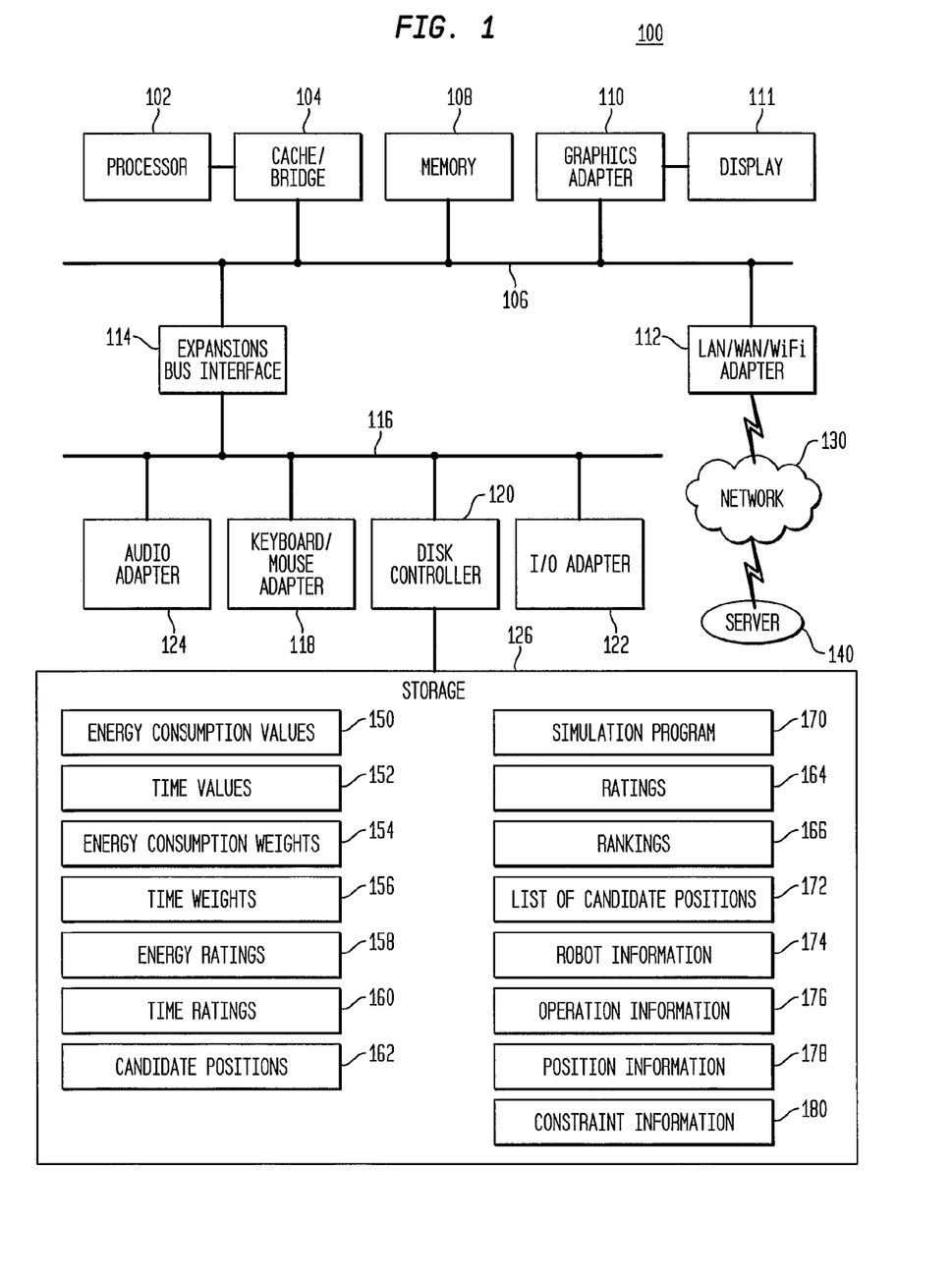
FIG. 1 illustrates a block diagram of a data processing system in which an embodiment can be implemented.

FIG. 1 illustrates a block diagram of a data processing system in which an embodiment can be implemented, for example as a PDM system particularly configured by software or otherwise to perform the processes as described herein, and in particular as each one of a plurality of interconnected and communicating systems as described herein. The data processing system illustrated can include a processor 102 connected to a level two cache/bridge 104, which is connected in turn to a local system bus 106. Local system bus 106 may be, for example, a peripheral component interconnect (PCI) architecture bus. Also connected to local system bus in the illustrated example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices. The storage 126 stores the energy consumption values 150, the cycle time values 152, the energy consumption weights 154, the cycle time weights 156, the energy ratings 158, the time ratings 160, the candidate positions 162, the ratings 164, the rankings 166, the simulation program 170, the list of candidate robot positions 172, the robot information 174, the operation information 176, the position information 178, the constraint information 180, and so on, which are described below.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure can include an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
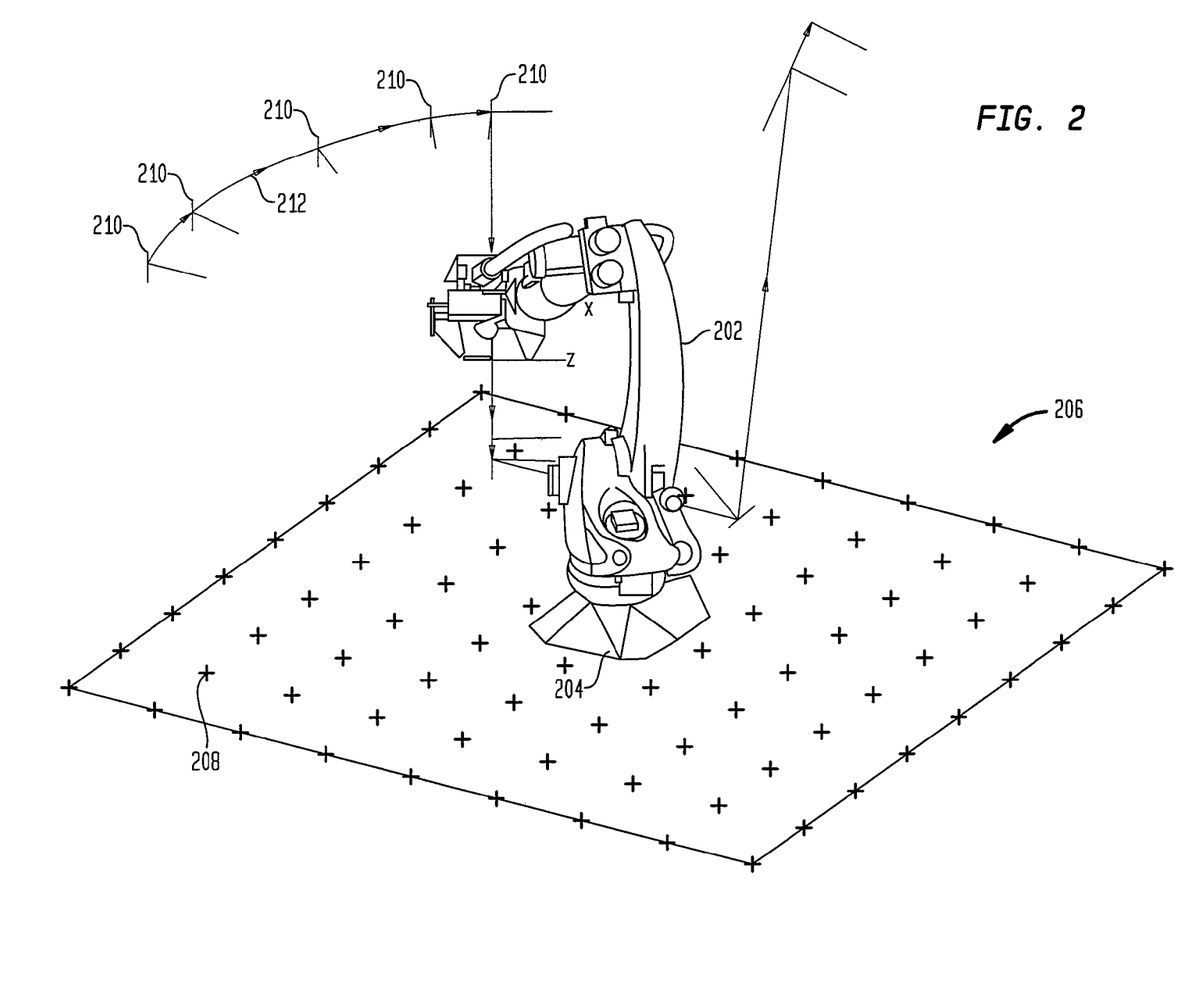
FIG. 2 illustrates a robot candidate position in accordance with the disclosed embodiments.

FIG. 2 illustrates a robot simulation in accordance with the disclosed embodiments. The simulated robot 202 is located at the candidate position 204 towards a center of the search space 206 that can include multiple candidate positions 208, illustrated as plus symbols in FIG. 2. The search space 206 illustrates eighty one candidate positions 208 that each yield different time values and energy consumption values. The simulated robot 202 is tasked to reach the locations 210, referred to as the set of operations 212. The optimal position of the simulated robot 202 is determined based on a ranking of a combination of the time values and energy consumption values for each of the eighty one candidate positions 208. Each simulated robot 202 has a position that is independent from its location, where the position refers to the position of the base of the robot and the location refers to the location of the tool at the end of the robot opposite from the base of the robot. Based on a simulation, a robot placed at the position 204 to perform the set of tasks to reach the locations 210, the overall energy used is determined to be 48.475 Joules (J) with a peak power of 2128 kilowatts (kW). These values are for example only and are not absolute.

Figure 3:
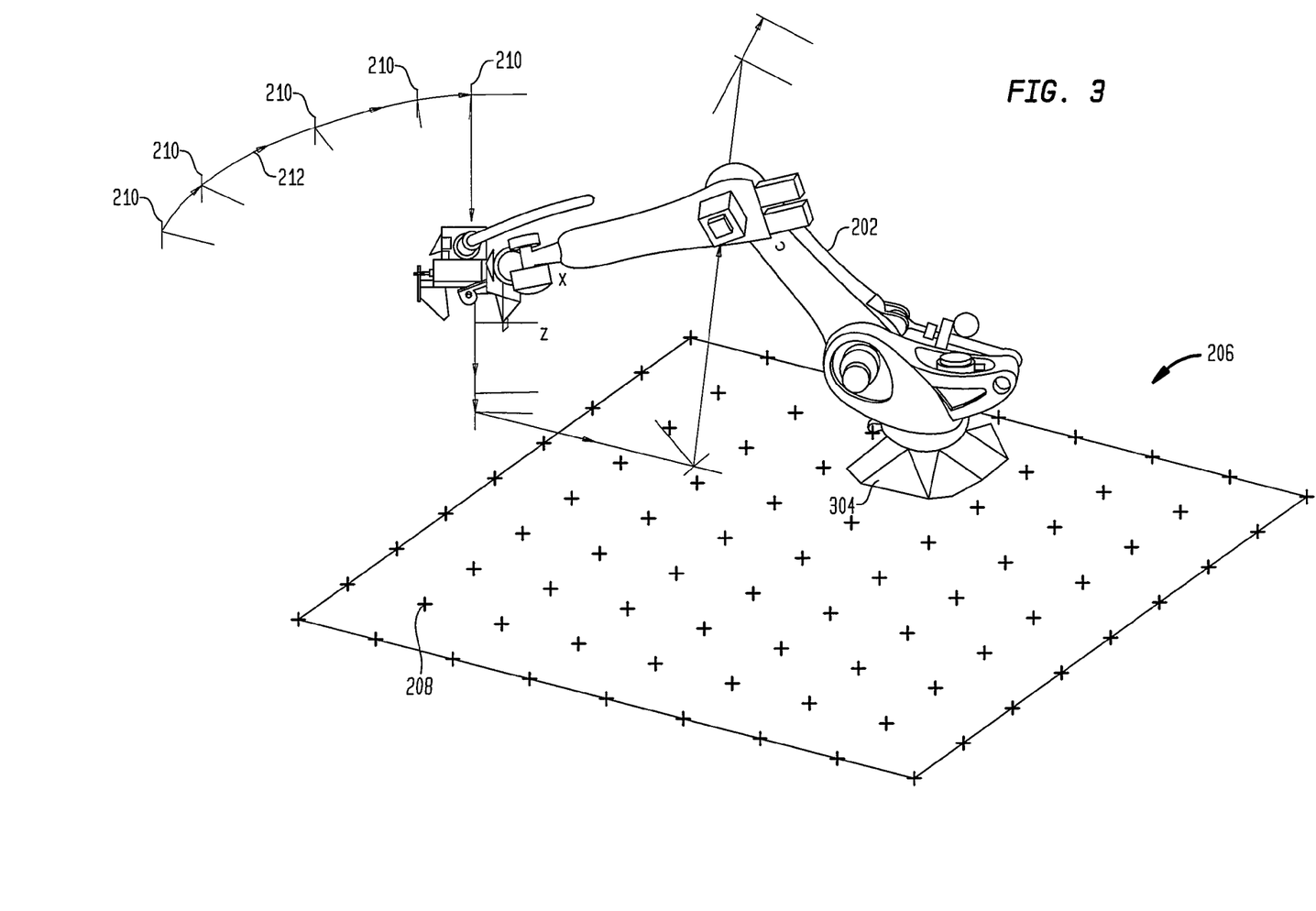
FIG. 3 illustrates a robot candidate position in accordance with the disclosed embodiments.

FIG. 3 illustrates a robot simulation in accordance with the disclosed embodiments. The simulated robot 202 is positioned at the candidate position 304 in the search space 206 that can include multiple candidate positions 208. Based on a set of operations, the simulated robot 202 is tasked to reach the locations 210. Compared to FIG. 2, the simulated robot 202 is given the same set of operations 212, but is placed at a different candidate position, candidate position 304. Based on a simulation, a robot placed at the candidate position 304 to perform the set of operations 212 to reach the locations 210, the overall energy used is determined to be 20.880 J with a peak power of 20.08 kW. Compared to the candidate position 204 of FIG. 2, placing the robot at the position 304 consumes 60% of the overall energy consumed at the position 204 and placing the robot at the position 304 would have a peak power that is 86% of the peak power at the position 204. These values are for example only and are not absolute in that there will not always be 60% energy consumption saving or 86% peak power savings.

Figure 4:
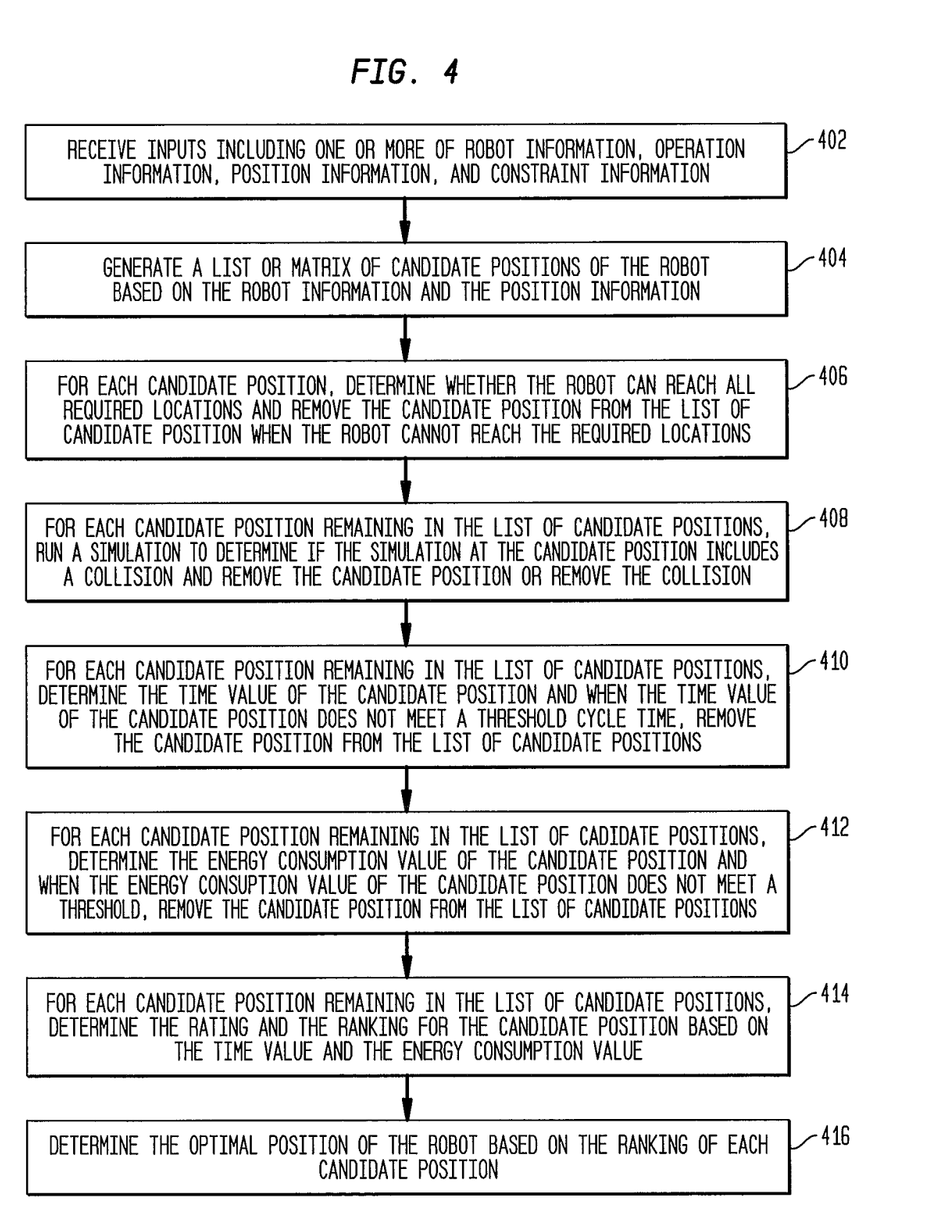
FIG. 4 illustrates a flowchart of a process to optimally locate a robot in accordance with disclosed embodiments.

FIG. 4 illustrates a flowchart of a process to optimally position a robot in accordance with disclosed embodiments. The energy consumption of the robot is realistic and accurate based on a realistic robot simulation (RRS) performed by a data processing system, such as the data processing system 100 of FIG. 1. The RRS interface is known to those of skill in the art, and is described at time of filing, for example, at realistic-robot-simulation.org. The RRS is as fast as a motion planning simulation and can include simulated values for energy consumption.

The system receives inputs including one or more of robot information, operation information, position information, and constraint information (step 402). The robot information can include a model of the robot that allows for simulation of the movements of the robot. The robot information also can include information related to the geometry or environment of the robot, the robot's surroundings, and any objects pertinent to the placement or location of the robot. The operation information can include a set of locations for the robot to reach. The position information can include a three-dimensional (3D) search field defined by a user from which a list of candidate positions can be generated. The 3D search field can include all of the possible positions where the robot can be placed or located within its work environment to perform the set of operations identified in the operation information. The constraint information can include one or more constraints that limit certain performance values related to a robot. The constraints can include one or more thresholds to limit the maximum amount of energy consumed or the maximum amount of time can be used to perform the set of operations. One or more of the processor 102, the memory 108, and the simulation program running on the processor 102 receive the inputs via one or more of the local system bus 106, the adapter 112, the network 130, the server 140, the interface 114, the I/O bus 116, the disk controller 120, the storage 126, and so on. Receiving, as used herein, can include retrieving from storage, receiving from another device or process, receiving via an interaction with a user, or otherwise.

The system generates a list or matrix of candidate positions of the robot based on the robot information and the position information (step 404). Each candidate position is a position within the 3D search field at which the robot may be placed or located to perform the set of operations to reach the set of locations.

For each candidate position remaining in the list of candidate positions, the system determines whether the robot can reach all required locations and the system removes the candidate positions from the list of candidate positions when the robot cannot reach all required locations (step 406). The candidate positions generated from the 3D search space can include positions where the robot is not long enough or is otherwise unable to reach a location required to perform the set of operations. When it is determined that a robot operating from a candidate position cannot reach all the required locations from the candidate position, the candidate position is removed from the list of candidate positions.

For each candidate position remaining in the list of candidate positions, the system runs an RRS simulation to determine if the simulation at the candidate position includes a collision and the system removes the candidate position from the list of candidate positions if the simulation at the candidate position includes a collision (step 408). The simulation uses the robot information, the operational information, and the position information to simulate performance of these set of operations by the robot at the candidate position. When a simulation at the candidate position includes a collision, the candidate position is removed from the list of candidate positions. In certain embodiments, instead of removing the candidate position from the list of candidate positions. The collision is removed by one or more of adding one or more flyby or additional locations, changing the orientation of the location, changing the configuration of the robot, and so on. Flyby locations are described, for example, in U.S. Patent Publication 2011/0153080 A1, which is hereby incorporated by reference.

For each candidate position remaining in the list of candidate positions, the system determines the time value of the candidate position and when the time value of the candidate position does not meet a threshold (e.g., the cycle time defined by the user), then the system removes the candidate position from the list of candidate positions (step 410). The time value is determined by the simulation at the candidate position. The time value indicates the time it takes for the robot to complete the set of operations at the candidate position for which the simulation was run. The candidate position is removed from the list of candidate positions when the time value exceeds the threshold of the cycle time.

For each candidate position remaining in the list of candidate positions, the system determines the energy consumption value of the candidate position and when the energy consumption value of the candidate position does not meet a threshold, the system removes the candidate position from the list of candidate positions (step 412). The energy consumption value is determined by the simulation at the candidate position. The energy consumption value indicates the amount of energy consumed by the robot in order to complete the set of operations at the candidate position for which the simulation was run. The candidate position is removed from the list of candidate positions when the energy consumption value exceeds the threshold.

For each candidate position remaining in the list of candidate positions, the system determines a rating and a ranking for the candidate position based on the time value and the energy consumption value (step 414). The rating is a combination of one or more of the energy consumption value, the time value, an energy consumption weight (EW), a time weight (TW), an energy rating (ER), and a time rating (TR), which are further described below. The combination of values for the rating can be linear, nonlinear, logarithmic, exponential, and so on. The ranking is based on the rating for each candidate position. Each rating can be weighted.

The system determines the optimal position of the robot based on the ranking of each candidate position (step 416). The optimal position of the robot is determined from the ranking of each candidate position. The ranking of each candidate position based on or determined from the rating of each candidate position. The optimal position has an optimal combination of energy consumption and time. The optimal combination of energy consumption and time is determined from one or more formulas.

Figure 5:
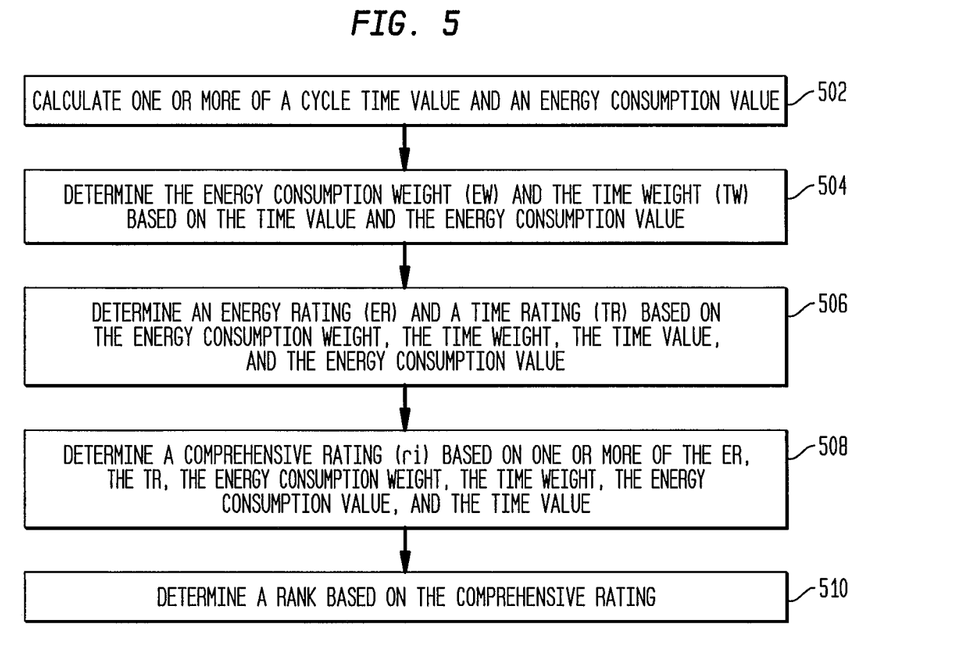
FIG. 5 illustrates a flowchart of a process to rank a robot candidate position in accordance with disclosed embodiments.

FIG. 5 illustrates a flowchart of a process to rank a candidate position in accordance with disclosed embodiments.

The system calculates the time value and the energy consumption value (step 502). The time value and the energy consumption value can be calculated from an RRS simulation that is run on all locations for a candidate position within a search space of the possible positions of the robot. The system simulates the robot performing the set of operations/locations at the candidate position of the robot and the simulation provides the time value and the energy consumption value.

The system determines the energy consumption weight (EW) and the time weight (TW) based on the time value and the energy consumption value (step 504). Each of the EW and the TW can be constant or based on a combination of values including the time value and the energy consumption value via a formula.

The system determines an energy rating (ER) and a time rating (TR) based on the energy consumption weight, the time weight, the time value, and the energy consumption value (step 506). In certain embodiments, the ER and the TR can be determined via equations (1) and (2):

$$ER = \frac{EW}{EW + TW} \quad (1)$$

$$TR = \frac{TW}{EW + TW} \quad (2)$$

The system determines a comprehensive normalized rating ($r_i$) based on one or more of the ER, the TR, the energy consumption weight, time weight, the energy consumption value, and time value (step 508). In certain embodiments, the normalized rating ($r_i$) is determined via equation (3):

$$r_i = \frac{w_i \cdot ER}{\sum_{i=0}^{n} w_i} + \frac{t_i \cdot TR}{\sum_{i=0}^{n} t_i} \quad (3)$$

where $r_i$ is the normalized rating for the candidate position i, $W_i$ is the energy consumption value for the candidate position i, and $t_i$ is the time value for the candidate position i.
where n is the number of candidate positions and:

$$R = \sum_{i=o}^{n} r_i = 1 \quad (4)$$

so that the sum of all normalized ratings ($r_i$) is equal to 1 and the ranking of each candidate position is based on all of the normalized ratings of the candidate positions.

In the example shown in Table 1, the EW and the TW are constants and the ER and the TR can be determined via a formula based off of the EW and the TW, where ER is calculated via equation (1) and TR is calculated via equation (2). In Table 1, i references the candidate position; EW=50 and TW=20; ER and TR are constant as determined by the formulas above, with ER=0.71 and TR=0.29. The energy consumption values ($W_i$) and the time values ($t_i$) vary for each candidate position. Each candidate position is rated ($r_i$) and ranked ($R_i$).

TABLE 1

| i  | 1     | 2     | 3     | 4     | 5     | 6     | 7     | 8     | 9     | 10    |
|----|-------|-------|-------|-------|-------|-------|-------|-------|-------|-------|
| EW |       |       |       |       | 50    |       |       |       |       |       |
| TW |       |       |       |       | 20    |       |       |       |       |       |
| ER |       |       |       |       | 0.71  |       |       |       |       |       |
| TR |       |       |       |       | 0.29  |       |       |       |       |       |
| Wi | 44    | 29    | 29    | 50    | 63    | 21    | 42    | 48    | 62    | 49    |
| ti | 16    | 15    | 17    | 13    | 20    | 13    | 12    | 15    | 12    | 19    |
| ri | 0.102 | 0.076 | 0.079 | 0.106 | 0.141 | 0.059 | 0.091 | 0.107 | 0.124 | 0.116 |

Based on the energy consumption ($W_i$), the time ($t_i$), the ER, the TR, and the $r_i$, candidate position 6 provides the optimal position as shown by the rating $r_6$=0.059 having the lowest value of all the $r_i$ values.

In the example shown in Table 2, the EW, TW, ER, and TR are formulaic, where EW is calculated via equation (6), TW is calculated via equation (7), ER is calculated via equation (1), and TR is calculated via equation (2).

$$EW = |\log_{1/2} t_i| \quad (6)$$

$$TW = |1 - EW| \quad (7)$$

In Table 2, i references the candidate position; EW and TW can be determined for each candidate position i; and ER and TR can be determined from the for each candidate position i. The energy consumption values ($W_i$) and the time values ($t_i$) vary for each candidate position. Each candidate position is rated ($r_i$) and ranked.

TABLE 2

| i  | 1     | 2     | 3     | 4     | 5     | 6     | 7     | 8     | 9     | 10    |
|----|-------|-------|-------|-------|-------|-------|-------|-------|-------|-------|
| EW | 4.00  | 3.91  | 4.09  | 3.70  | 4.32  | 3.70  | 3.58  | 3.91  | 3.58  | 4.25  |
| TW | 3.00  | 2.91  | 3.09  | 2.70  | 3.32  | 2.70  | 2.58  | 2.91  | 2.58  | 3.25  |
| ER | 0.57  | 0.57  | 0.57  | 0.58  | 0.57  | 0.58  | 0.58  | 0.57  | 0.58  | 0.57  |
| TR | 0.43  | 0.43  | 0.43  | 0.42  | 0.43  | 0.42  | 0.42  | 0.43  | 0.42  | 0.43  |
| Wi | 44    | 29    | 29    | 50    | 63    | 21    | 42    | 48    | 62    | 49    |
| ti | 16    | 15    | 17    | 13    | 20    | 13    | 12    | 15    | 12    | 19    |
| ri | 0.103 | 0.080 | 0.086 | 0.102 | 0.139 | 0.064 | 0.089 | 0.105 | 0.116 | 0.118 |

Based on the energy consumption ($W_i$), the time ($t_i$), the ER, the TR, and the $r_i$, candidate position 1 provides the optimal position as shown by the rank $r_6$=0.064 having the lowest value of all the $r_i$ values.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being illustrated or described herein. Instead, only so much of a data processing system as is unique to the present disclosure or necessary for an understanding of the present disclosure is illustrated and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for product data management, the method performed by a data processing system and comprising:
   receiving inputs including one or more of robot information, operation information, position information, and constraint information;
   generating a list of candidate positions of a robot based on the robot information and the position information;
   for each candidate position, determining a time value of the candidate position and when the time value of the candidate position does not meet a threshold cycle time value, removing the candidate position from the list of candidate positions;
   for each candidate position, determining an energy consumption value of the candidate position;
   for each candidate position, determining one or more of a rating and a ranking for the candidate position based on the time value and the energy consumption value;
   determining an optimal position of the robot based on the ranking of each candidate position; and
   positioning the robot in the optimal position.

2. The method of claim 1, further comprising:
   for each candidate position, when the energy consumption value of the candidate position does not meet a threshold, removing the candidate position from the list of candidate positions.

3. The method of claim 1, further comprising:
   for each candidate position, determining whether the robot can reach all required locations from the candidate position and removing the candidate position from the list of candidate positions when the robot cannot reach all the required locations from the candidate position.

4. The method of claim 1, further comprising:
   for each candidate position, running a simulation to determine if the simulation at the candidate position includes a collision and one of:
   removing the candidate position from the list of candidate positions if the simulation at the candidate position includes a collision; and
   removing the collision from the candidate position via one or more of adding one or more flyby locations, changing an orientation of a location, and changing a configuration of the robot.

5. The method of claim 1, further comprising:
   for each candidate position, determining an energy consumption weight (EW) and a time weight (TW) based on the time value and the energy consumption value.

6. The method of claim 5, further comprising:
   for each candidate position, determining an energy rating (ER) and a time rating (TR) based on the EW, the TW, the time value, and the energy consumption value.

7. The method of claim 6, further comprising:
   for each candidate position, determining a rating based on one or more of the ER, the TR, the EW, the TW, the energy consumption value, and the time value.

8. A data processing system comprising:
   a processor; and
   an accessible memory, the data processing system particularly configured to:
   receive inputs including one or more of robot information, operation information, position information, and constraint information;
   generate a list of candidate positions of a robot based on the robot information and the position information;
   for each candidate position, determine a time value of the candidate position and when the time value of the candidate position does not meet a threshold cycle time value, remove the candidate position from the list of candidate positions;
   for each candidate position, determine an energy consumption value of the candidate position;
   for each candidate position, determine one or more of a rating and a ranking for the candidate position based on the time value and the energy consumption value;
   determine an optimal position of the robot based on the ranking of each candidate position; and
   cause the robot to be positioned in the optimal position.

9. The data processing system of claim 8, wherein the data processing system is further configured to:
   for each candidate position, when the energy consumption value of the candidate position does not meet a threshold, remove the candidate position from the list of candidate positions.

10. The data processing system of claim 8, wherein the data processing system is further configured to:
    for each candidate position, determine whether the robot can reach all required locations from the candidate position and remove the candidate position from the list of candidate positions when the robot cannot reach all the required locations from the candidate position.

11. The data processing system of claim 8, wherein the data processing system is further configured to:
    for each candidate position, run a simulation to determine if the simulation at the candidate position includes a collision and one of:
    remove the candidate position from the list of candidate positions if the simulation at the candidate position includes a collision; and remove the collision from the candidate position via one or more of adding one or more flyby locations, changing an orientation of a location, and changing a configuration of the robot.

12. The data processing system of claim 8, wherein the data processing system is further configured to:
for each candidate position, determine an energy consumption weight (EW) and a time weight (TW) based on the time value and the energy consumption value.

13. The data processing system of claim 12, wherein the data processing system is further configured to:
for each candidate position, determine an energy rating (ER) and a time rating (TR) based on the EW, the TW, the time value, and the energy consumption value.

14. The data processing system of claim 13, wherein the data processing system is further configured to:
for each candidate position, determine a rating based on one or more of the ER, the TR, the EW, the TW, the energy consumption value, and the time value.

15. A non-transitory computer-readable medium encoded with executable instructions that, when executed, cause one or more data processing systems to:
receive inputs including one or more of robot information, operation information, position information, and constraint information;
generate a list of candidate positions of a robot based on the robot information and the position information;
for each candidate position, determine a time value of the candidate position and when the time value of the candidate position does not meet a threshold cycle time value, remove the candidate position from the list of candidate positions;
for each candidate position, determine an energy consumption value of the candidate position;
for each candidate position, determine one or more of a rating and a ranking for the candidate position based on the time value and the energy consumption value;
determine an optimal position of the robot based on the ranking of each candidate position; and
cause the robot to be positioned in the optimal position.

16. The computer-readable medium of claim 15, wherein the executable instructions, when executed, further cause the one or more data processing systems to:
for each candidate position, when the energy consumption value of the candidate position does not meet a threshold, remove the candidate position from the list of candidate positions.

17. The computer-readable medium of claim 15, wherein the executable instructions, when executed, further cause the one or more data processing systems to:
for each candidate position, determine whether the robot can reach all required locations from the candidate position and remove the candidate position from the list of candidate positions when the robot cannot reach all the required locations from the candidate position.

18. The computer-readable medium of claim 15, wherein the executable instructions, when executed, further cause the one or more data processing systems to:
for each candidate position, run a simulation to determine if the simulation at the candidate position includes a collision and one of:
remove the candidate position from the list of candidate positions if the simulation at the candidate position includes a collision; and
remove the collision from the candidate position via one or more of adding one or more flyby locations, changing an orientation of a location, and changing a configuration of the robot.

19. The computer-readable medium of claim 15, wherein the executable instructions, when executed, further cause the one or more data processing systems to:
for each candidate position, determine an energy consumption weight (EW) and a time weight (TW) based on the time value and the energy consumption value.

20. The computer-readable medium of claim 15, wherein the executable instructions, when executed, further cause the one or more data processing systems to:
for each candidate position, determine an energy rating (ER) and a time rating (TR) based on an EW, a TW, the time value, and the energy consumption value; and
for each candidate position, determine a rating based on one or more of the ER, the TR, the EW, the TW, the energy consumption value, and the time value.

* * * * *